(12) United States Patent
Mosna, Jr. et al.

(10) Patent No.: US 6,996,897 B2
(45) Date of Patent: Feb. 14, 2006

(54) METHOD OF MAKING A MOUNT FOR ELECTRONIC DEVICES

(75) Inventors: Frank J. Mosna, Jr., Tempe, AZ (US); Alexander J. Elliott, Tempe, AZ (US); William M. Strom, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 436 days.

(21) Appl. No.: 10/208,867

(22) Filed: Jul. 31, 2002

(65) Prior Publication Data

US 2004/0022016 A1 Feb. 5, 2004

(51) Int. Cl.
*B23P 15/00* (2006.01)
(52) U.S. Cl. .......................... 29/827; 29/825; 438/123; 257/685
(58) Field of Classification Search .................. 29/827, 29/832, 840–841, 593; 257/685, 777; 361/762, 361/772, 792; 438/118, 123
See application file for complete search history.

(56) References Cited

U.S. PATENT DOCUMENTS

| | | | |
|---|---|---|---|
| 4,668,471 A * | 5/1987 | Futatsuka et al. ........... 420/477 |
| 4,829,362 A | 5/1989 | Tran et al. |
| 5,049,973 A | 9/1991 | Satriano et al. |
| 5,068,764 A | 11/1991 | Bland et al. |
| 5,233,222 A | 8/1993 | Djennas et al. |
| 5,535,509 A * | 7/1996 | Tomita et al. ................. 29/827 |
| 5,566,749 A | 10/1996 | Jordan et al. |
| 5,594,234 A | 1/1997 | Carter, Jr. et al. |
| 5,661,338 A * | 8/1997 | Yoo et al. .................... 257/676 |
| 5,685,069 A * | 11/1997 | Peter et al. .................... 29/827 |
| 5,767,443 A | 6/1998 | Farnworth et al. |
| 5,773,878 A | 6/1998 | Lim et al. |
| 5,856,911 A | 1/1999 | Riley |
| 5,910,640 A | 6/1999 | Farnworth et al. |
| 5,930,601 A | 7/1999 | Cannizzaro et al. |
| 5,969,949 A | 10/1999 | Kim et al. |
| 5,969,950 A | 10/1999 | Tantoush |
| 6,049,125 A | 4/2000 | Brooks et al. |
| 6,326,242 B1 | 12/2001 | Brooks et al. |
| 6,358,775 B1 | 3/2002 | Hsia |
| 6,691,398 B1 * | 2/2004 | Gutierrez .................... 29/592.1 |
| 2004/0022016 A1 * | 2/2004 | Mosna et al. ................ 361/683 |

FOREIGN PATENT DOCUMENTS

| | | |
|---|---|---|
| EP | 0 409 196 A2 | 7/1990 |
| EP | 0 452 634 A1 | 2/1991 |
| EP | 0 887 850 A2 | 12/1998 |
| JP | 55009401 | 1/1980 |
| JP | 09064266 | 3/1997 |
| JP | 10321791 | 12/1998 |

OTHER PUBLICATIONS

PCT International Search Report PCT/US03/22548 mailed Jan. 29, 2004.

* cited by examiner

*Primary Examiner*—Minh Trinh
(74) *Attorney, Agent, or Firm*—Dillon & Yudell LLP

(57) ABSTRACT method for making a mount for at least two electronic devices forming a first mounting surface (210) from a material (240), and forming a second mounting surface (220) from the material (240). The first mounting surface (210) is connected to, but spaced from, the second mounting surface (220) by a mounting surface distance (250). The method further comprises reducing the mounting surface distance (250).

12 Claims, 3 Drawing Sheets

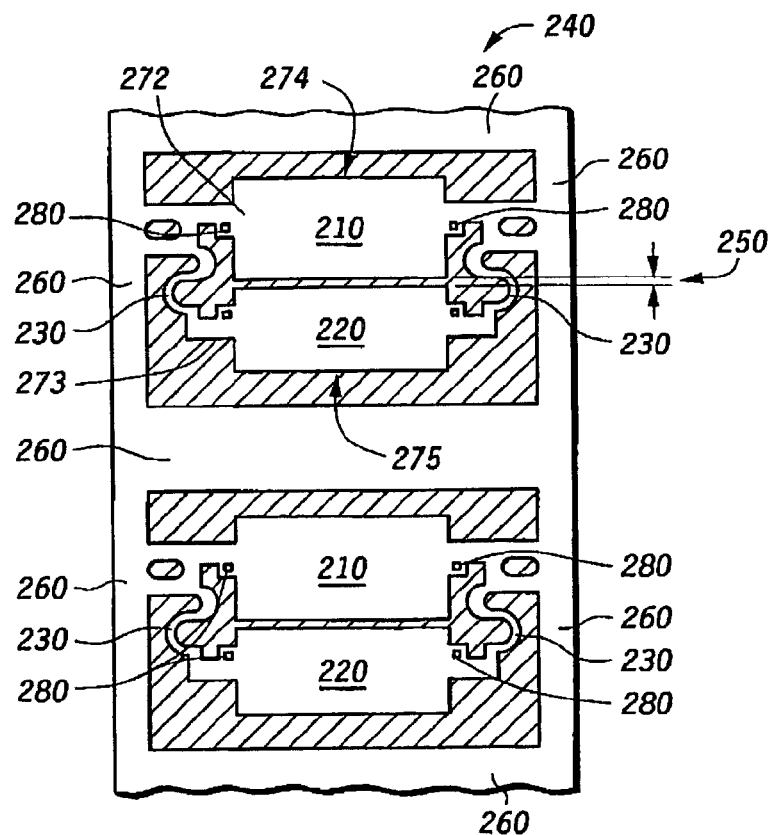
*FIG.3*
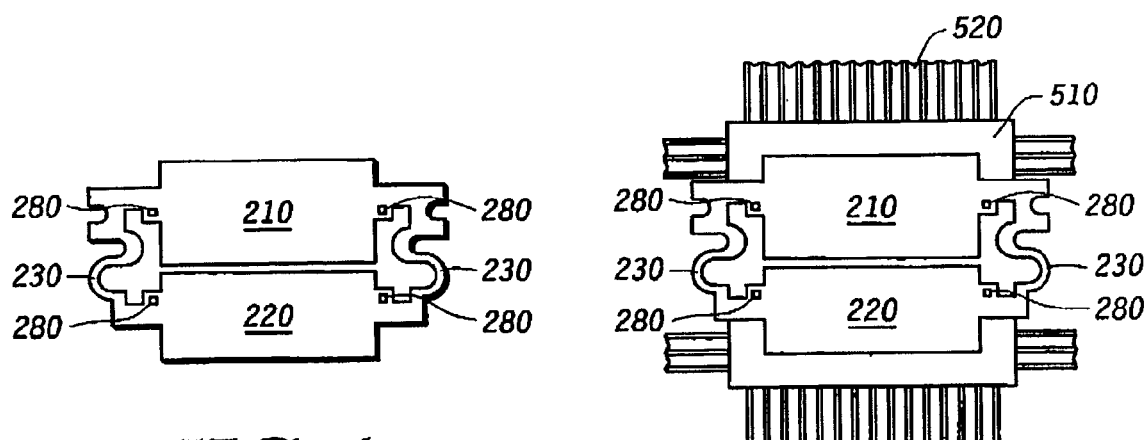
*FIG.4*   *FIG.5*

US 6,996,897 B2

METHOD OF MAKING A MOUNT FOR ELECTRONIC DEVICES

BACKGROUND OF THE INVENTION

The present invention relates generally to mounting electronic devices.

FIG. 1 illustrates aspects of a conventional multi-die package. The package has a power die 110 and a control die 120, both of which are secured to a mounting surface (commonly called a "flag" 130).

In many applications, the power die 110 and the control die 120 must be electrically isolated. One conventional method is to attach at least one die (such as the control die 120) to the flag 130 with a non-conductive epoxy compound (not seen). Typically, the epoxy compound is applied by placing dots of epoxy compound on the flag 130 and then using pressure to push the control die 120 onto the flag 130. The epoxy compound is squeezed out evenly under the control die 120. If the epoxy compound layer is too thin, however, there is not enough electrical isolation. This may cause the control die 120 or the power die 110 to short.

To electrically isolate the control die 110 and the power die 120 by physically isolating the mounting surfaces of the control die 110 and the power die 120 has proven to be difficult or costly. First, to simply create two separate mounting surfaces and then attach each of those mounting surfaces to another leadframe (not illustrated), requires more components than a single flag 130. This increases cost and forces a larger package size.

Furthermore, stamping two mounting surfaces out of a single material is constrained because stamping causes the stamped material to become bent or deformed. This deformation interferes with the assembly and operation of the electronic package. Thus, the thicker the material to be stamped, the greater the required physical isolation of the two mounting surfaces. This drives up the total size of the package.

BRIEF DESCRIPTIONS OF THE FIGURES

FIG. 3 shows a reduced gap between two mounting surfaces in accordance with the present invention.

FIG. 4 shows two singulated mounting surfaces in accordance with the present invention.

FIG. 5 shows two mounting surfaces attached to the leadframe in accordance with the present invention.

DETAILED DESCRIPTION OF EXAMPLE EMBODIMENTS OF THE PRESENT INVENTION

Figure 1:
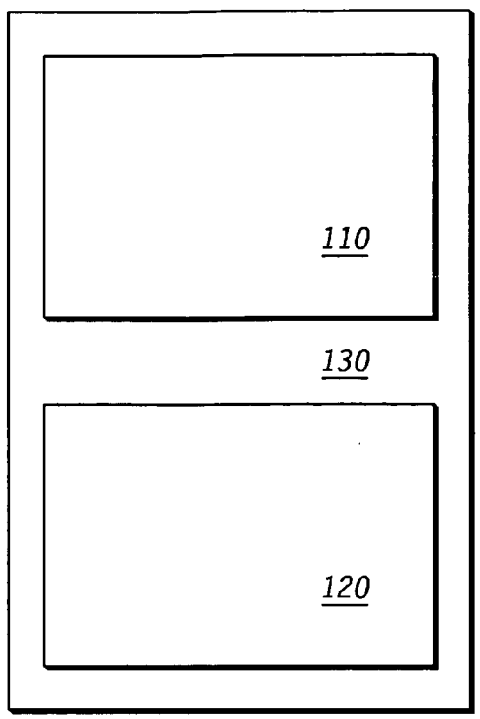
FIG. 1 shows a control die and a power die attached to a flag in accordance with the prior art.
Figure 2:
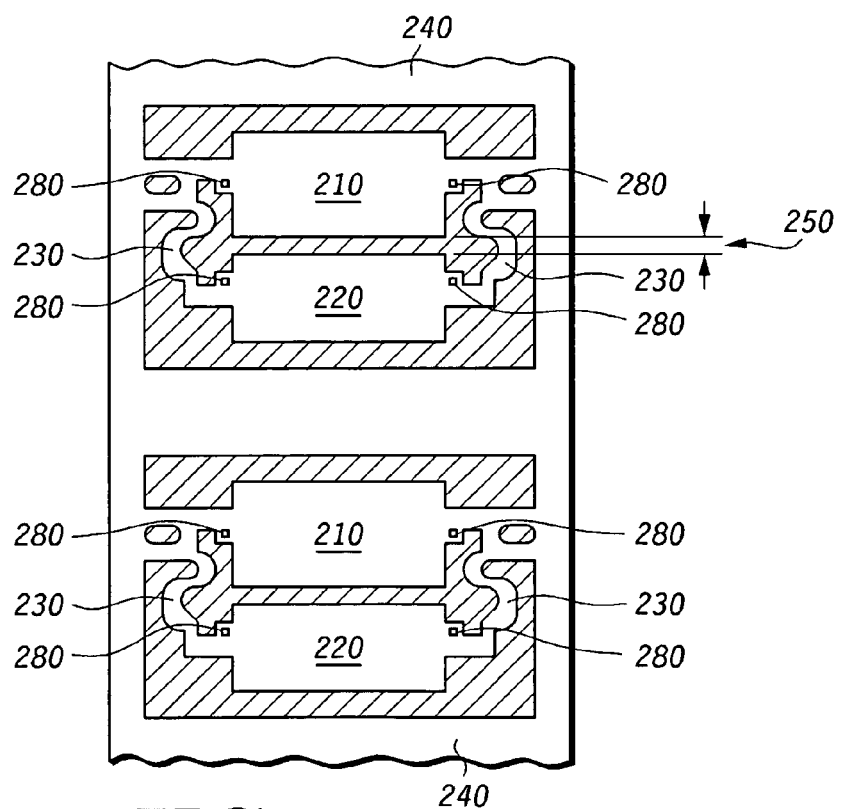
FIG. 2 shows the result of forming a plurality of mounting surfaces in accordance with the present invention.

FIG. 2 illustrates various aspects of an example embodiment of the present invention. In one example embodiment, a method of making a mount for at least two electronic devices is provided. The method comprises stamping a first mounting surface 210 from a material 240 and stamping a second mounting surface 220 from the material 240. Commonly, the material 240 comprises oxygen-free high-conductive copper alloy, but in alternate embodiments, any suitable material is substituted for copper alloy. Depending on manufacturing conditions, in some embodiments, many first mounting surfaces 210 and second mounting surfaces 220 are stamped out of the same material 240 wherein the second stamped surface 220 is mechanically connected with the first surface 210.

In the illustrated embodiment, the mounting surfaces 210 and 220 are stamped by progressive stamping with a standard stamping tool, which stamps out the shape to be formed by making many individual stamps. The hatched region indicates the areas of the material 240 that are removed.

The first mounting surface 210 and the second mounting surface 220 are, in some embodiments, stamped with a collapsible connection 230 on either side of the first mounting surface 210 and second mounting surface 220. Between the first mounting surface 210 and the second mounting surface 220 is a gap 250. Attachment holes 280 are formed on either side of the first mounting surface 210 and the second mounting surface 220. The function of these attachment holes 280 is explained below.

Conventional stamping cannot stamp the gap 250 between the first mounting surface 210 and the second mounting surface 220 less than about 1.5 times the thickness of the material 240 (for most materials and stamping methods). In no case is it believed a material suitable for electronics can be stamped closer than about 1.2 times the thickness. Therefore, the first mounting surface 210 and the second mounting surface 220 are stamped with a gap 250, which is at least 1.2 times the thickness of the material 240; and, many times, is greater than 1.5 times the thickness of material 240. However, for many applications, the thickness of the material 240 causes the gap 250 to be too large. Therefore, it is desirable for the gap 250 to be reduced.

FIG. 3 illustrates an example embodiment of the first mounting surface 210 and the second mounting surface 220 with the gap 250 reduced. In example embodiments of the invention, various methods are used to reduce the gap 250 to below the 1.5 or 1.2 times material thickness limit. Generally, a force is used to deform the collapsible connection 230 and bring the first mounting surface 210 and the second mounting surface 220 closer together. For example, applying a force on the outside 274 of the first mounting surface 210 and the outside 275 of the second mounting surface 220 deforms the collapsible connection 230. In another example, force is applied to the outsides 272 and 273 of the collapsible connection 230. In alternate embodiments, the force is applied with a conventional tool or a tool specifically designed for reducing the gap 250. Examples of conventional tools include stamping tools, clamps, presses, and crimpers to name only a few. In one embodiment, a specifically designed tool (not illustrated) uses a V-shape. The open end of the "V" is pressed downward on the outsides 274 and 275 to provide a narrowing surface against which the first and second mounting surfaces 210 and 220 are pressed.

Although the illustrated example shows a curved shape (here in the specific form of an "S") for the collapsible connection 230, any deformable connection suffices. For example, the collapsible connection 230 is not limited to the type of deforming associated with a curved shape. In still a further embodiment, a straight connection having a weak area (for example, a thinner cross-section than surrounding portions of material 240) bends upon application of pressure. In still a further embodiment, a straight link with no designed-in weakened area is used. An important function of the collapsible connection 230, in any event, is that it comprises a deformable means for holding the mounting surfaces 210 and 220 at the distance at which they are formed while being pliable enough to reduce the gap 250 to a distance desired for use in a package upon application (directly or indirectly) of some force to the connection 230.

In a further embodiment, once the gap 250 is reduced to a desired distance, the first mounting surface 210, the second mounting surface 220, and the collapsible connections 230 are "singulated" by, for example, cutting them from the outer edges 260 (sometimes called "rails") and the rest of the material 240. FIG. 4 illustrates a singulated first mounting surface 210 and second mounting surface 220, with attachment holes 280, and two collapsible connections 230.

In still a further embodiment, as illustrated in FIG. 5, the singulated first mounting surface 210 and second mounting surface 220 are mounted onto a leadframe 510. The leadframe 510 includes a plurality of leads 520, which are used to provide electrical communication to electronic devices to be mounted on first and second mounting surfaces 210 and 220. The leadframe 510 comprises holes (not seen), which correspond to the attachment holes 280 on either side of the first mounting surface 210 and the second mounting surface 220. The first mounting surface 210 and second mounting surface 220 are staked to the leadframe 510 by staking a pin or rivet through the attachment holes 280 on either side of the first mounting surface 210 and second mounting surface 220 and the leadframe 510. The edges of the pin or rivet are deformed, securing the mounting surfaces 210 and 220 to the leadframe 510. In various alternate embodiments, the mounting surfaces 210 and 220 are attached to the leadframe 510 by soldering, gluing, or any other method of attaching.

Figure 6:
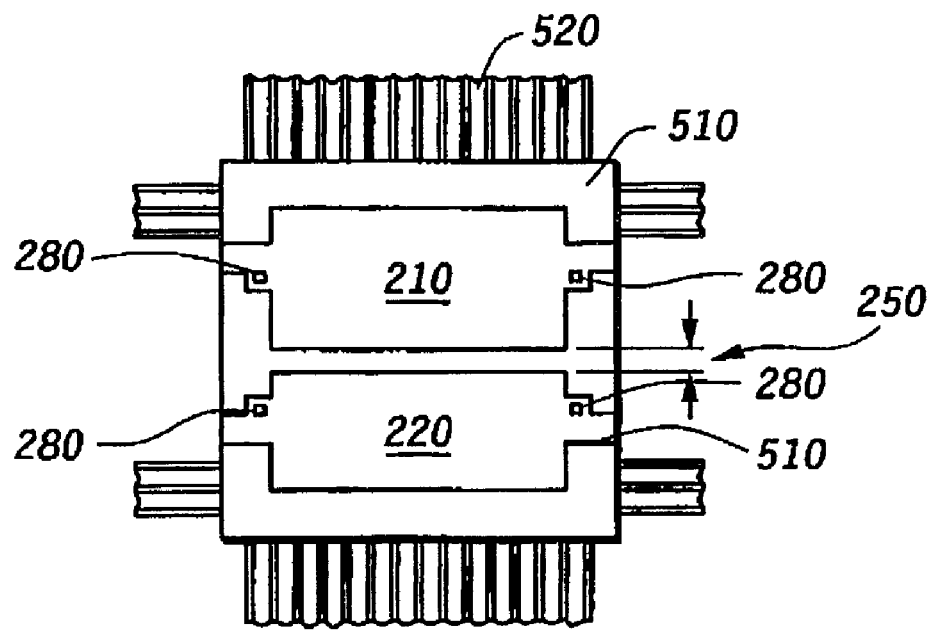
FIG. 6 shows two mounting surfaces with the gap filled in accordance with the present invention.

In a further embodiment, illustrated in FIG. 6, once the first mounting surface 210 and the second mounting surface 220 are attached to the leadframe 510, the collapsible connections 230 are removed (e.g., by cutting). By removing the collapsible connections 230, the first mounting surface 210 and the second mounting surface 220 are physically and electrically isolated.

Figure 7:
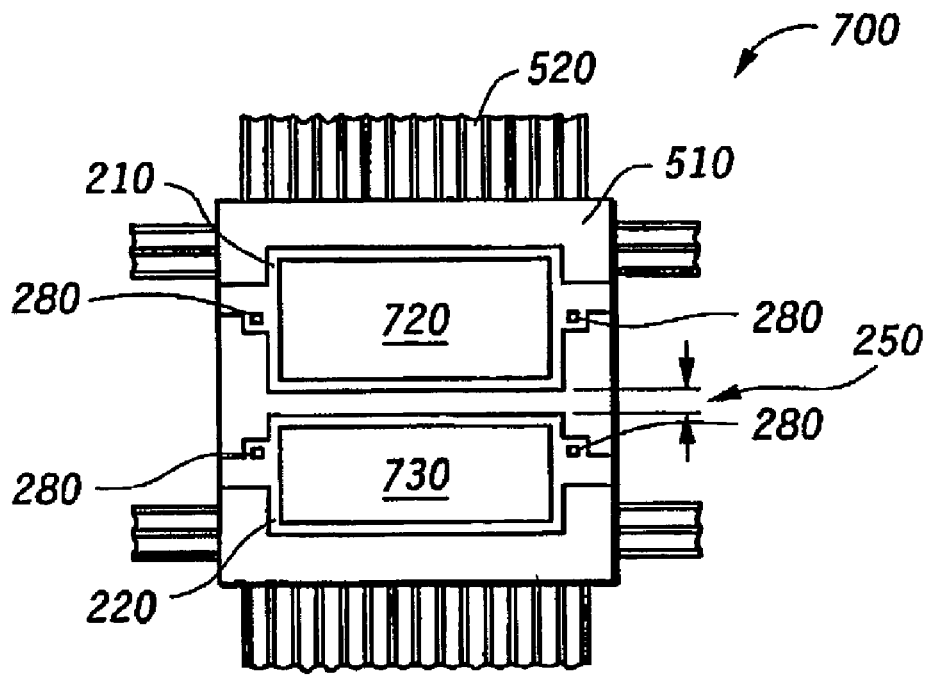
FIG. 7 shows an electronic device package with two electronic devices mounted on two mounting surfaces in accordance with the present invention.

As seen in FIG. 7, with the first mounting surface 210 and the second mounting surface 220 electrically isolated and attached to the leadframe 510, electronic components 720 and 730 are attached to the first and second mounting surfaces 210 and 220 (for example, by soldering, gluing, or any other method of attaching electronic components) creating a circuit 700.

In still a further embodiment, after electronic components 720 and 730 are mounted on the mounting surfaces 210 and 220, an encapsulant is applied and surrounds the circuit 700 and fills the gap 250. Filling the gap 250 further electrically isolates the first mounting surface 210 and the second mounting surface 220. In various embodiments, the encapsulant comprises plastic, rubber, or any other encapsulant used in semiconductor technology.

In some embodiments, one side of each of the mounting surfaces 210 and 220 is not encapsulated. Instead, the mounting surfaces 210 and 220 are left exposed to dissipate heat. In some embodiments (for example, power packages), the material of the first electronic component mounting surface 210 and the second electronic component mounting surface 220 is thicker than the material of the leadframe 510, which also provides heat dissipation.

The example embodiments of the present invention have been described with a certain degree of particularity; however, many changes may be made in the details without departing from the scope of the invention. It is understood that the invention is not limited to the embodiments set forth herein, but is to be limited only by the scope of the attached claims, including the full range of equivalency to which each is entitled.

We claim:

1. A method of making a mount for at least two electronic devices, the method comprising:
    stamping a first mounting surface from a material;
    stamping a second mounting surface from the material, wherein the first mounting surface is connected to, but spaced from, the second mounting surface by a mounting surface gap;
    forming a collapsible connection that connects the first mounting surface and the second mounting surface; and
    reducing the mounting surface gap.

2. The method of claim 1, wherein the reducing comprises reducing the mounting surface gap to less than about 1.5 times the thickness of the material.

3. The method of claim 2 wherein the reducing comprises reducing the mounting surface gap to less than about 1.2 times the thickness of the material.

4. The method of claim 1, wherein the first mounting surface and the second mounting surface are progressively stamped.

5. The method of claim 1, wherein the reducing comprises deforming the collapsible connection.

6. The method of claim 5, wherein the deforming comprises applying pressure to the collapsible connection.

7. The method of claim 1, further comprising attaching the mounting surface to a leadframe.

8. The method of claim 7, wherein the attaching comprises staking.

9. A method of making a mount for at least two electronic devics, the mothod comprising:
    stamping a first mounting surface from a material;
    stamping a second mounting surface from the material, wherein the first mounting surface is connected to, but spaced from, the second mounting surface by a mounting surface gap;
    reducing the mounting surface gap; and
    electrically isolating the first mounting surface and the second mounting surface.

10. The method of claim 9, wherein the isolating comprises removing a connection between the first mounting surface and the second mounting surface.

11. The method of claim 9, further comprising encapsulating the first mounting surface and the second mounting surface.

12. The method of claim 1, wherein the first mounting surface and the second mounting surface are stamped essentially concurrently.

* * * * *

UNITED STATES PATENT AND TRADEMARK OFFICE
CERTIFICATE OF CORRECTION

PATENT NO. : 6,996,897 B2  Page 1 of 1
APPLICATION NO. : 10/208867
DATED : July 31, 2002
INVENTOR(S) : Frank Joseph Mosna, Jr.

It is certified that error appears in the above-identified patent and that said Letters Patent is hereby corrected as shown below:

In Column 4, Line 40, Claim No. 9:
    Change "mothod" to --method--

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 6,996,897 B2  Page 1 of 1
APPLICATION NO. : 10/208867
DATED : February 14, 2006
INVENTOR(S) : Frank Joseph Mosna, Jr.

It is certified that error appears in the above-identified patent and that said Letters Patent is hereby corrected as shown below:

In Column 4, Line 40, Claim No. 9:
Change "mothod" to --method--

This certificate supersedes the Certificate of Correction issued May 13, 2008.

Signed and Sealed this

Third Day of June, 2008

JON W. DUDAS
*Director of the United States Patent and Trademark Office*